(12) United States Patent
Park

(10) Patent No.: US 7,368,361 B2
(45) Date of Patent: May 6, 2008

(54) BIPOLAR JUNCTION TRANSISTORS AND METHOD OF MANUFACTURING THE SAME

(75) Inventor: Kangwook Park, Seoul (KR)

(73) Assignee: Samsung Electronics Co., Ltd., Suwon-Si, Gyeonggi-do (KR)

(*) Notice: Subject to any disclaimer, the term of this patent is extended or adjusted under 35 U.S.C. 154(b) by 2 days.

(21) Appl. No.: 11/476,808

(22) Filed: Jun. 29, 2006

(65) Prior Publication Data

US 2006/0267149 A1  Nov. 30, 2006

Related U.S. Application Data

(62) Division of application No. 10/829,190, filed on Apr. 22, 2004, now Pat. No. 7,091,578.

(30) Foreign Application Priority Data

Jun. 19, 2003  (KR) .......................... 2003-0039897

(51) Int. Cl.
*H01L 21/331* (2006.01)

(52) U.S. Cl. .............. 438/343; 438/350; 257/591; 257/578; 257/586; 257/587; 257/E21.379

(58) Field of Classification Search ............... 438/343; 257/E21.379
See application file for complete search history.

(56) References Cited

U.S. PATENT DOCUMENTS

| | | | |
|---|---|---|---|
| 5,285,088 A | | 2/1994 | Sato et al. |
| 5,296,388 A | * | 3/1994 | Kameyama et al. ......... 438/370 |
| 5,708,281 A | * | 1/1998 | Morishita .................... 257/198 |
| 6,177,717 B1 | | 1/2001 | Chantre et al. |
| 6,316,818 B1 | | 11/2001 | Marty et al. |
| 6,362,065 B1 | | 3/2002 | Swanson et al. |
| 6,509,242 B2 | | 1/2003 | Frei et al. |
| 2002/0149062 A1 | | 10/2002 | Nii et al. |
| 2004/0222496 A1 | * | 11/2004 | Freeman et al. ............. 257/569 |

FOREIGN PATENT DOCUMENTS

| | | |
|---|---|---|
| EP | 0 621 641 A2 | 10/1994 |
| TW | 306072 | 5/1997 |
| TW | 494557 | 7/2002 |

* cited by examiner

*Primary Examiner*—Tu-Tu Ho
(74) *Attorney, Agent, or Firm*—Volentine & Whitt, P.L.L.C.

(57) ABSTRACT

A substrate has a collector region of a first conductivity type, and a base layer of a single crystalline structure and including impurities of a second conductivity type is located over the collector region. An emitter region is defined at least in part by impurities of the first conductivity type contained in the base layer. An emitter electrode of the first conductivity type contacts the emitter region, and at least a portion of the emitter electrode which is in contact with the emitter region has a single crystalline structure.

19 Claims, 11 Drawing Sheets

BIPOLAR JUNCTION TRANSISTORS AND METHOD OF MANUFACTURING THE SAME

CROSS-REFERENCE TO RELATED APPLICATIONS

This is a divisional of U.S. patent application Ser. No. 10/829,190, filed Apr. 22, 2004, now U.S. Pat. No. 7,091,578, issued Aug. 15, 2006, which is incorporated herein by reference in its entirety.

BACKGROUND OF THE INVENTION

1. Field of the Invention

The present invention generally relates to bipolar transistors. More particularly, the present invention relates to performance characteristics of a bipolar transistor at the interface between an emitter region and an emitter electrode of the bipolar transistor.

2. Description of the Related Art

FIG. 1 is a cross-sectional view of a conventional vertical bipolar transistor. In this example, an NPN transistor is shown, and accordingly, an N+ buried collector region 2 is located at a depth within a N− collector region 3 formed over a P− substrate 1. Typically, the N− collector region 3 is formed by epitaxial growth over the P− substrate 1. Also, as shown, LOCOS or STI insulating layers 4 are formed to isolate surface regions of the N− collector region 3.

A P+ base layer 5 is formed by epitaxial growth of single-crystal Si or SiGe over the N− collector region 3, and an N+ emitter region 6 is formed by doping impurities to a given depth within the P+ base layer 5. A P+ poly-silicon base electrode 7 and an N+ poly-silicon emitter electrode 8 respectively contact surfaces of the base region 5 and emitter region 6. The emitter region 6 is usually formed by diffusion of impurities from the poly-silicon emitter electrode 8 into the base region 5. The poly-silicon emitter electrode 8 is electrically insulated from the poly-silicon base electrode 7 by sidewall spacers 9 and insulating layer 10. Further, each of the poly-silicon base and emitter electrodes 7, 8 is covered with a silicide layer 11 for low-resistance contact to a metal interconnect (not shown).

An overdoped N+ region 12 is located below the emitter region 6 and extends between the base region 5 and the N+ buried collector region 2. Likewise, an N+ collector sink 13 extends from the N+ buried collector region 2 to the surface of the device for connection to a metal collector contact (not shown) via the silicide layer 11.

As is well know in the art, conductivity of the bipolar transistor is achieved by the injection of minority carriers from the emitter region 6 into the base region 5, thereby electrically connecting the emitter region 6 to the underlying N+ collector region 12. In this state, an electrical path is established from the emitter electrode 8 to the collector sink 13 via the overdoped collector region 12 and the buried collector region 2.

Various techniques have been applied in the art in an effort to enhance performance characteristics of the bipolar transistor. For example, a so-called heterojunction bipolar transistor is known in which the emitter region is formed with a higher band gap than the underlying base region, thus facilitating the injection of minority carriers into the base region. One exemplary heterojunction device is formed by stacking epitaxially grown layers SiGe and Si over the collector region, and then doping a region of the upper Si layer to define the emitter. The bandgap of the Si emitter is wider than that of SiGe base, thus enhancing injection efficiency. It is also known that injection efficiency can be further enhanced by providing a graded distribution of Ge in the SiGe layer to achieve a non-uniform band-gap.

Notwithstanding these and other improvements relating to the emitter characteristics within the base, there still exist a demand for bipolar transistors having higher performance efficiencies.

Returning to FIG. 1, the conventional configuration is characterized by the deposition of doped poly-silicon between the sidewall spacers 8 and over the insulating layer 26. This doped poly-silicon directly contacts the emitter region 6 and forms the emitter electrode 8 of the transistor.

As mentioned above, the emitter region 6 is usually formed by diffusion of impurities from the deposited emitter electrode into the base region 5. As also mentioned above, the base region 5 is formed by epitaxial growth of single-crystal Si and/or SiGe over the collector region 3. As such, the poly-crystalline structure of the gate electrode 8 directly contacts the single-crystalline structure of the emitter region 6. This abrupt change in crystalline structure creates a resistive component at the interface between the emitter region 6 and the emitter electrode 8. This resistive component appears in the conductive path of the transistor, thus degrading performance.

Further, due to process limitations, the deposition of poly-silicon directly onto the emitter region results in substantial defects at the interface between the two. These defects further increase the resistive component at the interface.

SUMMARY OF THE INVENTION

According to a first aspect of the present invention, a bipolar transistor is provided which includes a substrate having a collector region of a first conductivity type, a base layer of a single crystalline structure and including impurities of a second conductivity type located over the collector region, and an emitter region defined at least in part by impurities of the first conductivity type contained in the base layer. The bipolar transistor further includes an emitter electrode of the first conductivity type contacting the emitter region, where at least a portion of the emitter electrode which is in contact with the emitter region has a single crystalline structure.

According to another aspect of the present invention, a bipolar transistor is provided which includes a substrate having a collector region of a first conductivity type, a base region of a single crystalline structure and of a second conductivity type located over the collector region, and an emitter region defined at least in part by impurities of the first conductivity type contained in the base layer. The bipolar transistor further includes an emitter electrode including an epitaxially grown layer of the first conductivity type contacting the emitter region.

According to still another aspect of the present invention, a method for forming an emitter contact of a bipolar transistor is provided which includes growing an emitter electrode layer containing an impurity of a first conductivity type over the surface of a base layer of a second conductivity type, where at least a portion of the emitter layer in contact with the base layer is grown having a single crystalline structure. The method further includes diffusing the impurity from the emitter electrode layer into the base layer to form an emitter region of the first conductivity type in the base layer, and forming a metal layer on the emitter electrode layer.

According to yet another aspect of the present invention, a method of forming a bipolar transistor is provided which includes forming a base layer, including growing a first epitaxial layer of a second conductivity type over an upper surface of a substrate of a first conductivity type, and forming a collector region of the first conductivity type in the substrate. The method further includes forming an emitter electrode layer over the base layer, including growing a second epitaxial layer containing an impurity of the first conductivity type from an upper surface of the first epitaxial layer. The method still further includes diffusing the impurity from the second epitaxial layer into the first epitaxial layer to form an emitter region of the first conductivity type in the first epitaxial layer, and forming an metal layer on the emitter electrode layer.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF THE PREFERRED EMBODIMENTS

The present invention will now be described in detail below with reference to several preferred but non-limiting embodiments.

Figure 1:
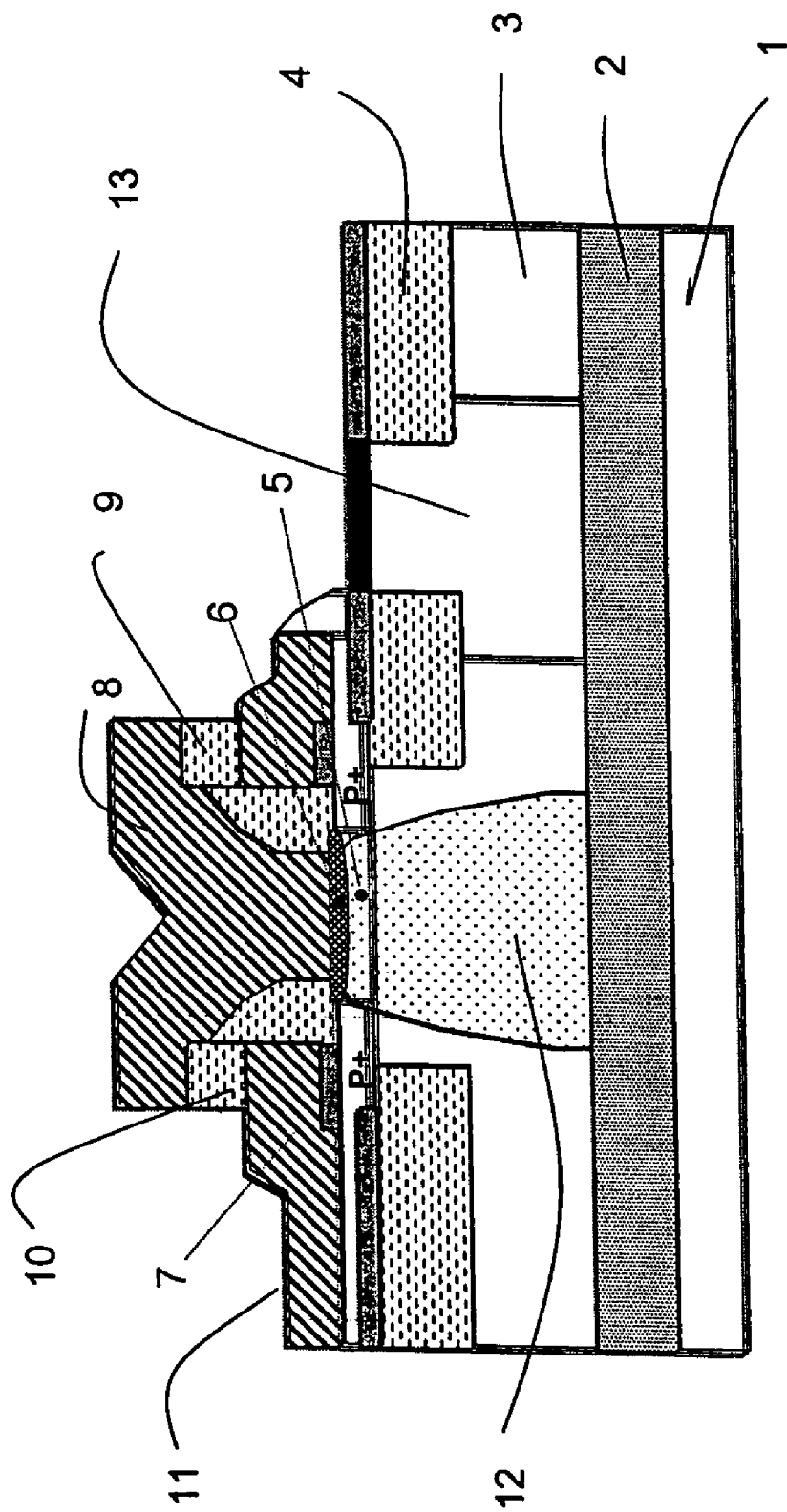
FIG. 1 is a cross-sectional view of a conventional bipolar transistor.
Figure 2:
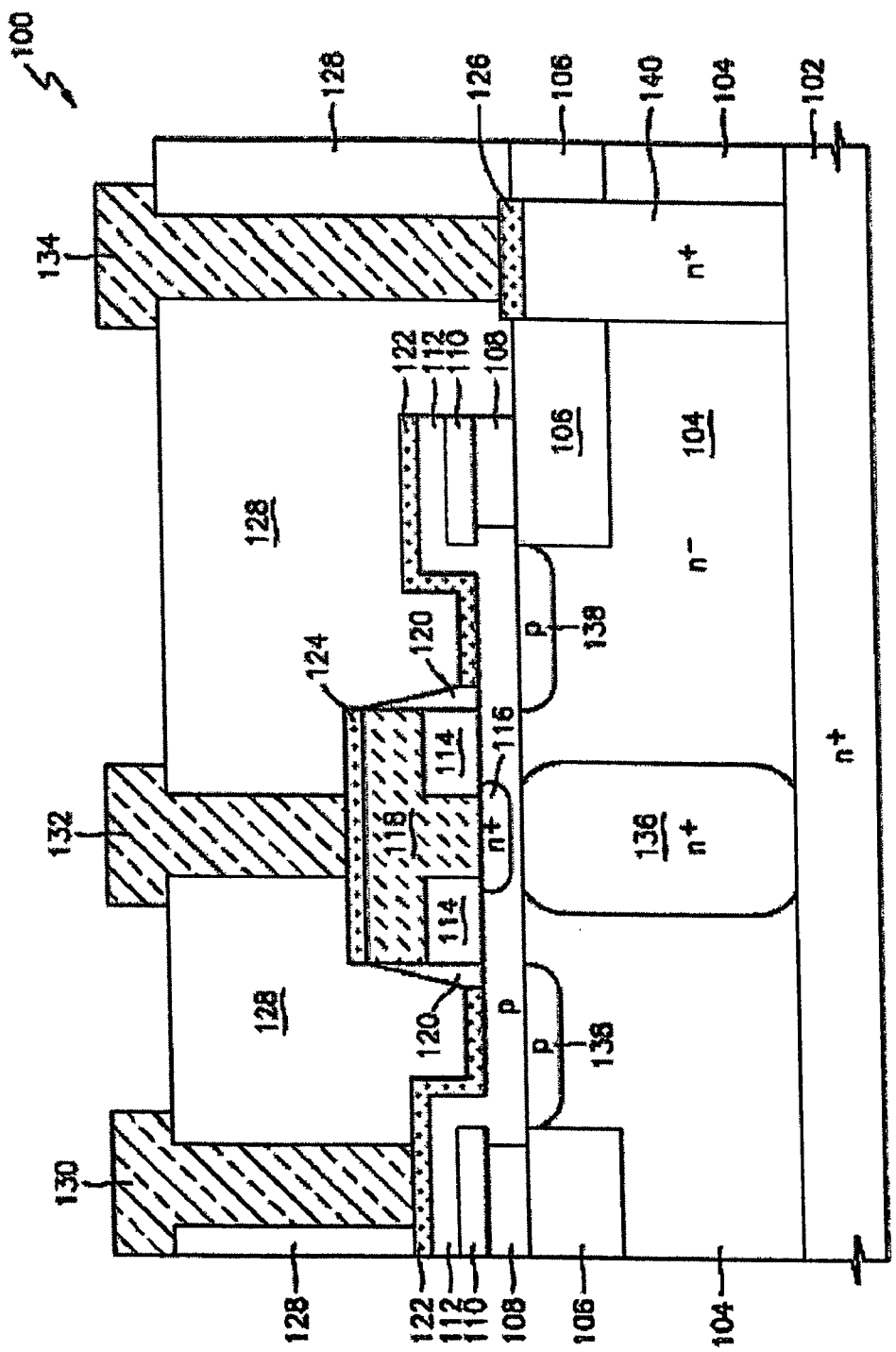
FIG. 2 is a schematic cross-sectional view of a bipolar transistor according to an embodiment of the present invention.

FIG. 2 illustrates a bipolar transistor 100 according to an embodiment of the present invention. In this example, an NPN transistor is shown, and accordingly, an N+ buried collector region 102 is located at a depth within an N− collector region 104 formed of a single-crystalline structure. Also, as shown, LOCOS or STI insulating layers 106 are included to isolate surface regions of the N− collector region 104.

A single-crystal P+ base layer 112 is located over the N− collector region 104, and an N+ single-crystalline emitter region 116 extends to a given depth within the P+ base layer 112. Optionally, as shown in FIG. 2, base regions 138 may be formed at a depth below the base layer 112. As examples only, the base layer 112 may be a single layer of Si, or stacked layers of SiGe and Si. That is, although not shown in detail, the transistor of FIG. 2 may optionally be a heterojunction device which is characterized by the stacking of epitaxially grown layers SiGe and Si to form the base layer 112, then doping a region of the upper Si layer to define the emitter 116. The bandgap of the Si emitter is wider than that of SiGe base, thus enhancing injection efficiency. Injection efficiency can be further enhanced by providing a graded distribution of Ge in the SiGe layer to achieve a non-uniform band-gap.

A silicide base electrode 122 is located on an upper surface of the base layer 112 and contacts a metal base contact 130 extending through an insulating or dielectric layer 128.

An N+ emitter electrode 118 contacts an upper surface of the emitter region 116. As will be discussed later, at least the portion of the emitter electrode 118 in contact with the emitter region 116 is substantially formed of a single-crystalline structure. In this particular example, an entirety of the emitter electrode 118 is substantially single-crystalline.

The emitter electrode 118 is electrically insulated from the base electrode 122 by sidewall spacers 120 and insulating layer 114. Further, an upper surface of the emitter electrode 118 is covered with a silicide layer 124, which in turn contacts a metal emitter contact 132 extending through the insulating layer 128.

An overdoped N+ region 136 is located below the emitter region 116 and extends between the base layer 112 and the N+ buried collector region 102. Likewise, an N+ collector sink 140 extends from the N+ buried collector region 102 to the surface of the device for connection to a metal collector contact 134 via a silicide layer 126.

Finally, reference numbers 108 and 110 denote an insulating layer and poly-silicon layer, respectively, which may optionally be included in the bipolar transistor.

Conductivity of the bipolar transistor of FIG. 2 is achieved by the injection of minority carriers from the emitter region 116 into the base region 112, thereby electrically connecting the emitter region 116 to the underlying N+ collector region 136. In this state, an electrical path is established from the emitter electrode 118 to the collector sink 140 via the over-doped collector region 136 and the buried collector region 102.

As mentioned above, both the emitter region 116 and emitter electrode 118 of this embodiment are single-crystalline. Thus, there is no abrupt change in crystalline structure at the interface between the emitter region 116 and the emitter electrode 118, and the resistive component otherwise caused at the interface is therefore reduced when compared to conventional devices having poly-crystalline emitter electrodes. Since this resistive component appears in the conductive path of the transistor, the current gain and speed of the bipolar transistor of this embodiment are increased.

A method of manufacturing the bipolar transistor of FIG. 2 will now be described with reference to FIGS. 3(A) through 3(F).

Figure 3A:
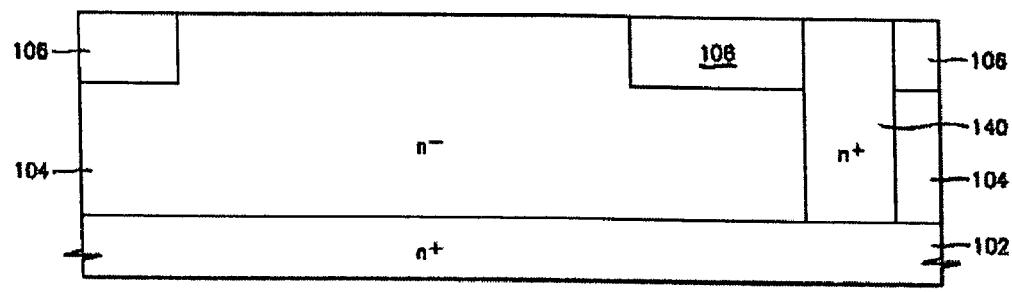
FIGS. 3(A) through 3(F) are schematic cross-sectional views for describing a method of manufacturing the bipolar transistor of FIG. 2.

Referring first to FIG. 3(A), a buried N+ collector region 102 and an N− collector region 104 are formed in a p-type semiconductor substrate (not shown). STI or LOCOS insulating regions 106 are then formed in the surface of the N− collector region 104, and an N+ collector sink 140 is formed through the N− collector region 104 to contact the N+ collector region 102.

Figure 3B:
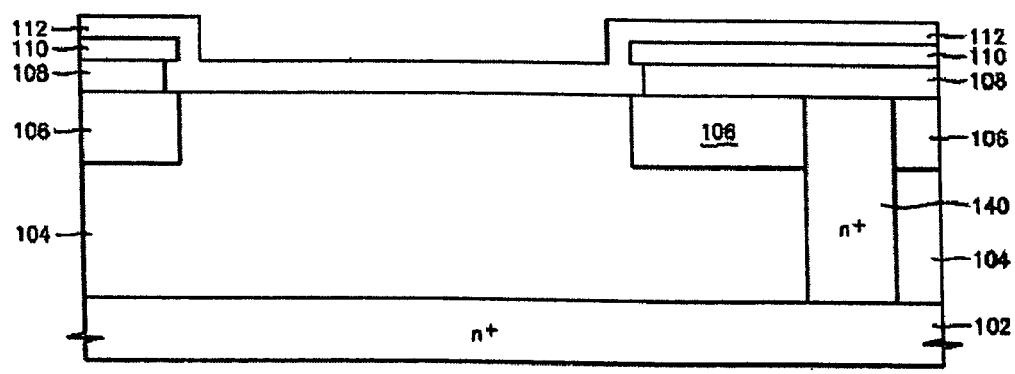

Referring to FIG. 3(B), one or more insulating layers 108 and poly-silicon layers 110 may be optionally patterned over the insulating regions 106. Material examples of the insulating layers 108 include SiN, SiON and SiO2. Then, a base layer 112 is formed by epitaxial growth of single-crystalline Si or SiGe. For example, in the case of a heterojunction device, the base layer 112 may be a SiGe layer comprised of a stack of a Si seed layer, a SiGe spacer layer, a doped-SiGe layer, and a Si capping layer.

Figure 3C:
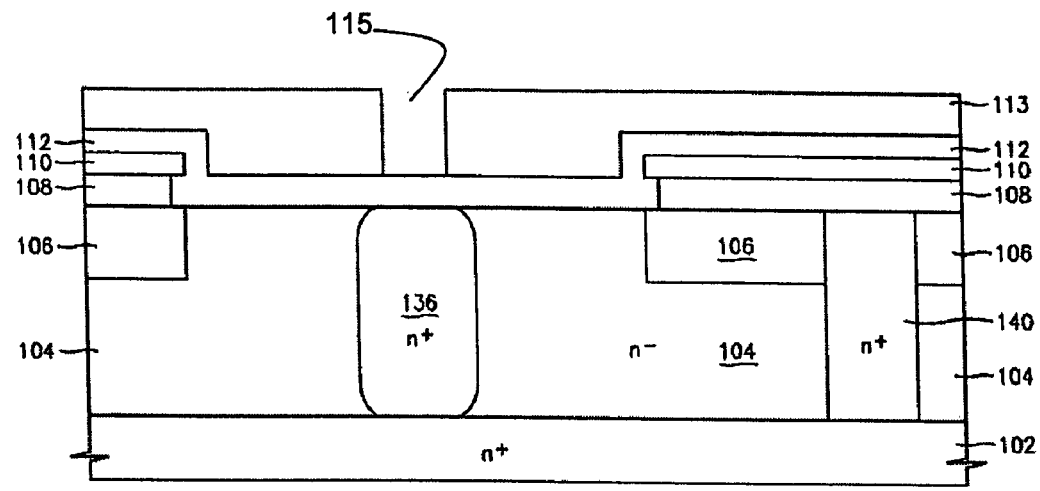

Next, as shown in FIG. 3(C), an insulating layer 113 is deposited and an emitter window 115 is formed therein. Then, an overdoped N+ collector region 136 is formed by ion implantation through the emitter window 115. Alternately, to avoid ion implantation damage to the base layer 112, the N+ collector region 136 can be formed prior to deposition of the base layer 112 by using a photoresist mask pattern on the structure shown in FIG. 3(A). In either case, the insulating layer 113 is deposited and the emitter window 115 is formed.

Figure 3D:
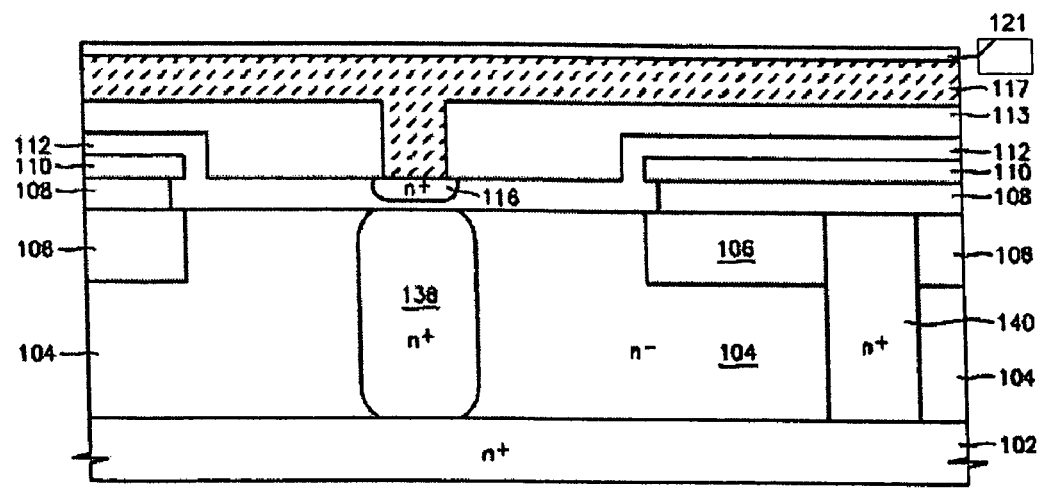
Figure 3E:
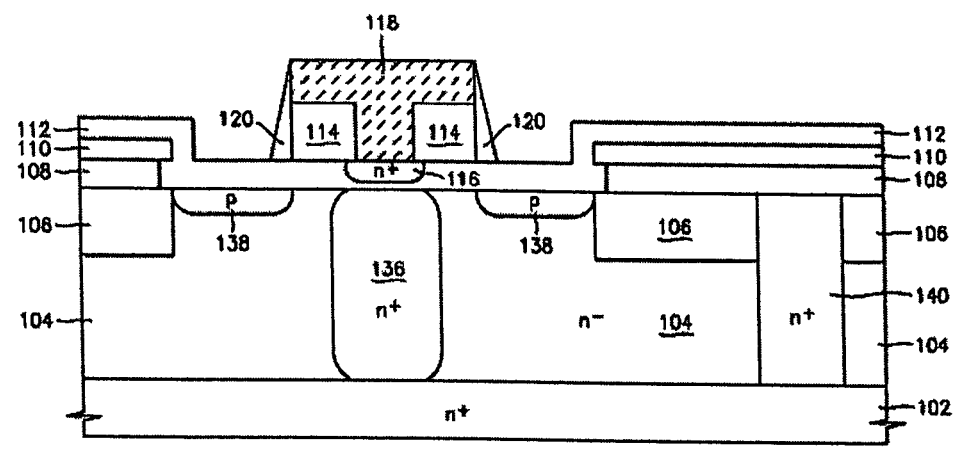

Next, as shown in FIG. 3(D), an emitter electrode layer 117 and a barrier layer 121 are formed. As shown, the emitter electrode layer 117 fills the emitter window 115 in the insulating layer 113 so as to contact the emitter region 116 (not yet formed).

In this embodiment, the emitter electrode layer 117 is formed by low temperature (less than 900° C.) epitaxial grown of single-crystalline Si, SiGe or a Si—SiGe composite. The emitter electrode layer 117 is N+ doped either in situ or by ion implantation, and preferably has a graded impurity concentration distribution in which an upper part of the emitter electrode layer 117 has a higher concentration than a lower part thereof. For example, the impurity concentration in the upper part may be in a range of $1 \times 10^{19}/cm^3$ to $1 \times 10^{22}/cm^3$, whereas the impurity concentration in the lower part may be in a range of $1 \times 10^{18}/cm^3$ to $1 \times 10^{20}/cm^3$.

Still referring to FIG. 3(D), after formation of the barrier layer 121, an emitter region 116 is then formed by diffusion of impurities during heat treatment from the emitter electrode layer 117 into an upper portion of the base layer 112. Alternately, however, the diffusion may progress during epitaxial growth of the emitter electrode layer 117, or the emitter region 116 may be formed by ion implantation prior to formation of the emitter electrode layer 117. In the case of a heterojunction device in which the base layer 112 is a SiGe layer, the emitter region 116 is formed in the Si capping layer or in the Si capping layer and doped-SiGe layer of the base layer 112.

Figure 3F:
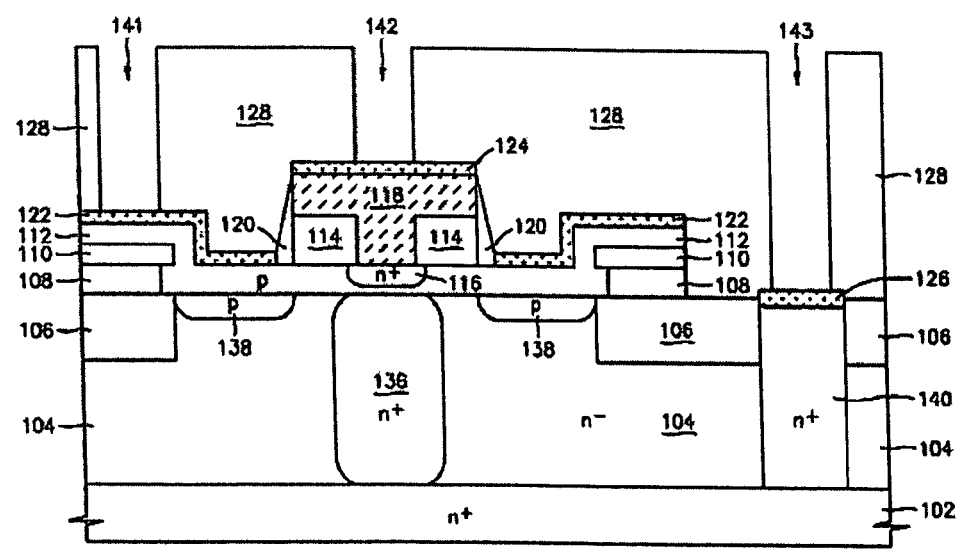

Next, as shown in FIG. 3(F), the emitter electrode layer 117 (FIG. 3(D)) is patterned by etching or chemical mechanical polishing to define an emitter electrode 118. Portions of the insulating layer 113 (FIG. 3(D)) which remain after patterning are identified by reference number 114 in FIG. 3(E). Insulating sidewall spacers 120 are then formed on the sidewalls of the emitter electrode 118 and insulating layers 114. Further, either before or after formation of the spacers 120, base regions 138 are formed in the N− collector region 104 by ion implantation of p-type impurities.

Referring now to FIG. 3(F), the base layer 112 and underlying layers 110, 108 are patterned to expose the collector sink 140. Then, a silicidation process is executed to form silicide layers 122, 124 and 126 on the base region 112, the emitter electrode 118, and the collector sink 140, respectively. An insulating layer 128 is deposited over the resultant structure, and contact holes 141, 142 and 143 are formed to expose the silicide layers 122, 124 and 126. Finally, though not shown in FIG. 3 (F), metal interconnects are filled into the contact holes 141, 142 and 143.

As described above, the emitter electrode 118 is formed by epitaxial growth of single-crystalline silicon from the single-crystalline base layer 112. The emitter region 116 is then formed by diffusion of impurities from the emitter electrode 118 into the base layer 112. Since both the emitter region 116 and emitter electrode 118 are single-crystalline, there is no abrupt change in crystalline structure at the interface between the emitter region 116 and the emitter electrode 118. In addition, the defects at the interface are substantially reduced when compared to conventionally devices having polysilicon emitter electrodes. Consequently, the resistance at the interface is reduced, and the current gain and speed of the bipolar transistor are increased.

The embodiments described above are at least partially characterized by the single-crystalline emitter electrode. However, the emitter electrode need not be single-crystalline throughout its entire structure. Rather, a portion of the emitter electrode not in contact with the single-crystalline emitter region may be formed of an amorphous or polycrystalline structure. This is conceptually illustrated in FIG. 4, which is a bipolar transistor according to another embodiment of the present invention.

Figure 4:
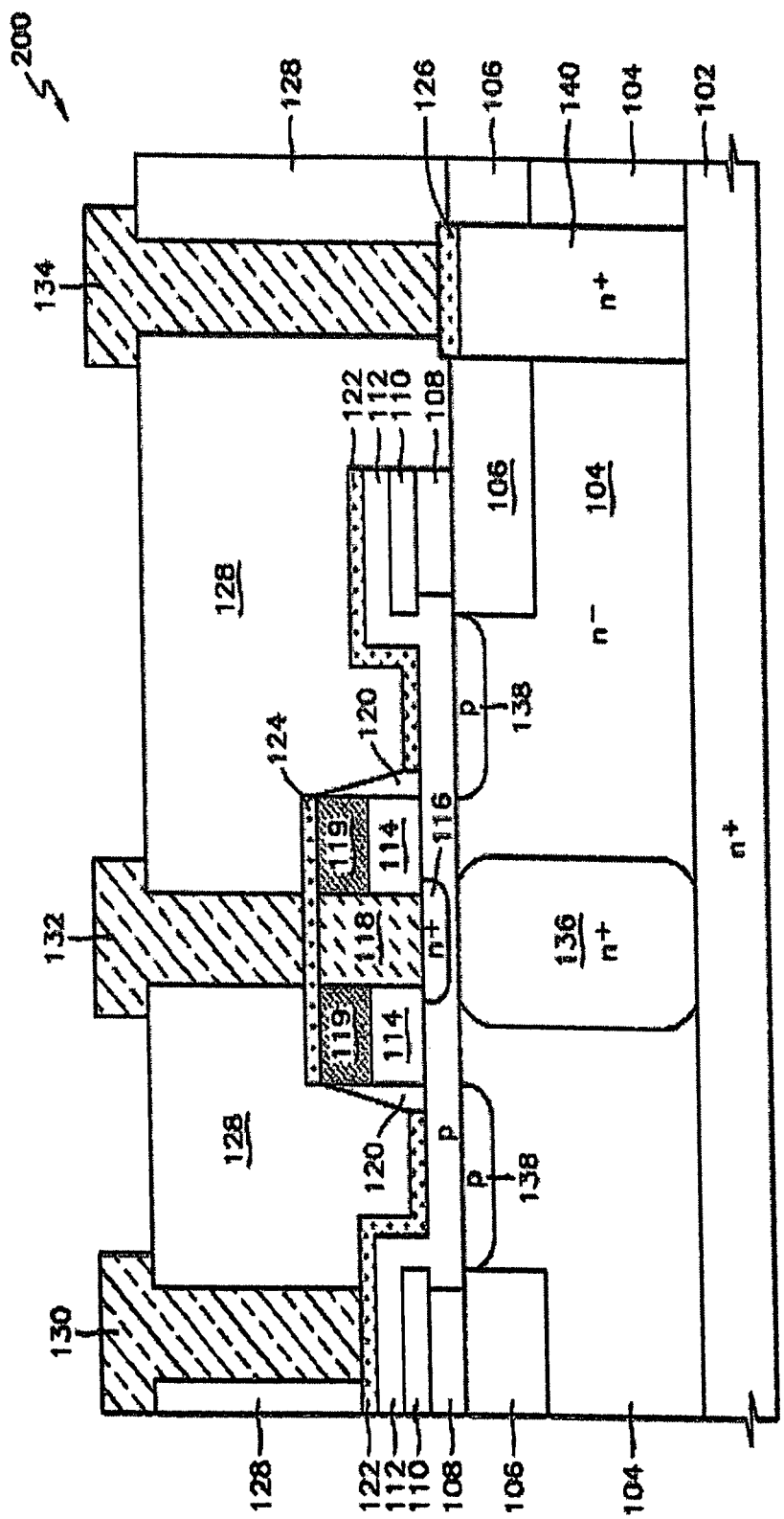
FIG. 4 is a schematic cross-sectional view of a bipolar transistor according to another embodiment of the present invention.

The emitter electrode of the bipolar transistor of FIG. 4 includes a single-crystalline portion 118 and an amorphous or polycrystalline portion 119. All other reference numbers of FIG. 4 denote the same numbered elements discussed above in connection with FIG. 2.

It should be noted that the demarcation line shown between the single-crystalline portion 118 and the amorphous or polycrystalline portion 119 in FIG. 4 is for illustrative purposes only. In actuality, by varying process conditions during growth of the emitter electrode, the transition from single-crystal to non-single-crystal may be gradual and arbitrarily located. This concept is described below in connection with FIG. 5. As a separate matter, as will be appreciated by those skilled in the art, the term single-crystal is meant to include materials that are substantially or predominantly of a single-crystal structure. Likewise, materials that are said to be poly-crystalline or amorphous include materials that are substantially or predominantly poly-crystalline or amorphous in structure.

Figure 5:
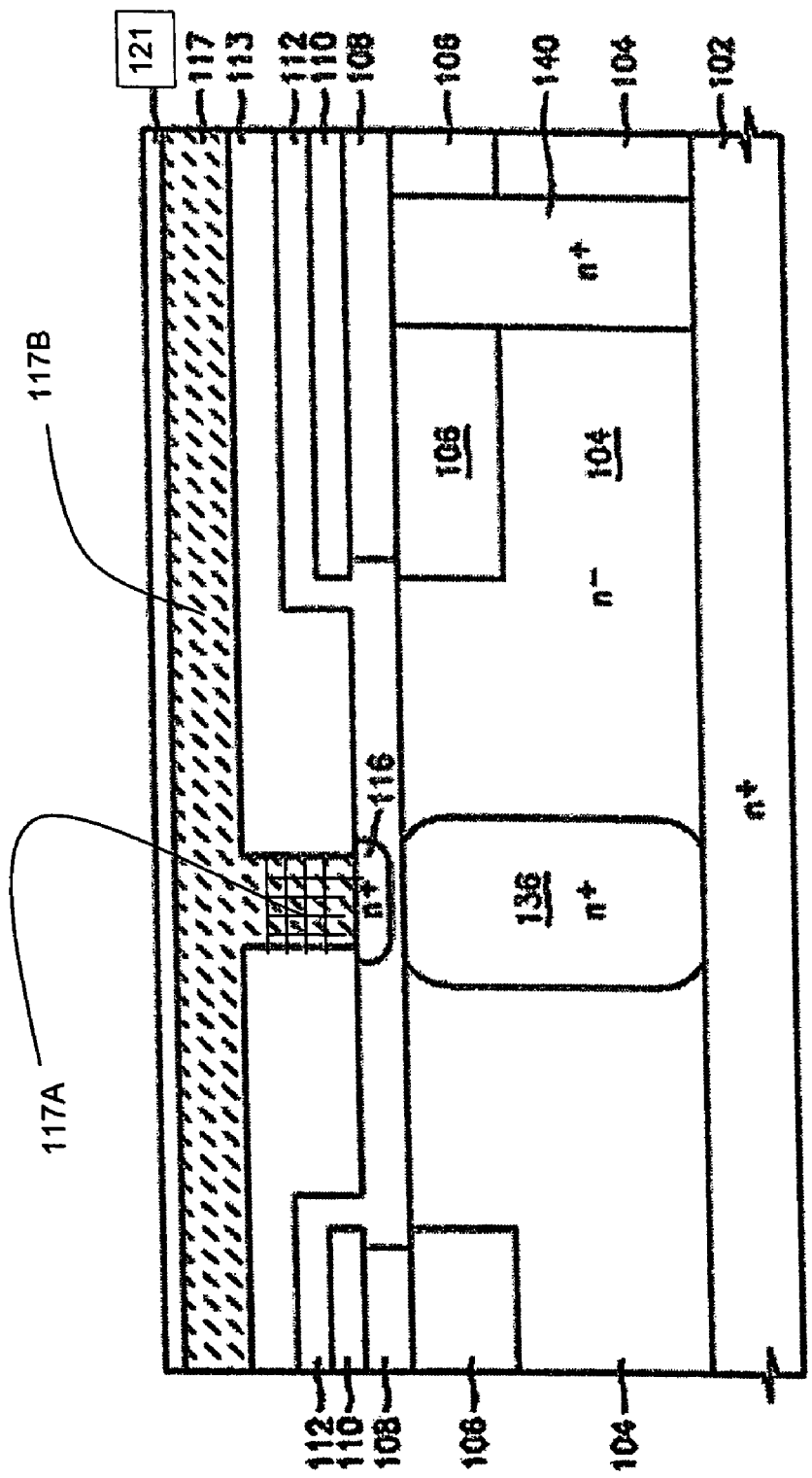
FIG. 5 is a schematic cross-sectional view for describing the growth of an emitter electrode according to an embodiment of the present invention.

FIG. 5 corresponds to previously described FIG. 3(D), except that the emitter electrode 117 is shown as including a single-crystal portion 117A and a poly-crystal portion 117B. Preferably, the emitter electrode 117 is formed by in situ growth of both portions 117A and 117B.

As an example, the single-crystal portion 117A may be formed by epitaxial growth at a low temperature (under 900° C.) of an N+ doped structure of Si, SiGE, or a composite thereof. Optionally, the impurity concentration may have a graded distribution. For example, the impurity concentration in the upper part may be in a range of $1 \times 10^{19}/cm^3$ to $1 \times 10^{22}/cm^3$, whereas the impurity concentration in the lower part may be in a range of $1 \times 10^{18}/cm^3$ to $1 \times 10^{20}/cm^3$.

Then, in the absence of a vacuum break following the epitaxial growth, the poly-crystal portion 117B may be formed by polycrystalline growth at a low temperature (under 900° C., for example 550° C.) of an N+ doped structure of Si, SiGE, or a composite thereof. Optionally, the impurity concentration may be relatively constant. For example, the impurity concentration may be in a range of $1 \times 10^{19}/cm^3$ to $1 \times 10^{22}/cm^3$.

The transition from epitaxial growth to poly-crystalline growth may be achieved by increasing the chamber pressure and/or decreasing the chamber temperature. As examples only, the transition may be realized by increasing chamber pressure from 20 torr to 300 torr, or by decreasing chamber temperature from 600° C. to 500° C. In addition, a more gradual change from single-crystal to poly-crystal can be obtained by ramping up of the chamber pressure over time during growth of the emitter electrode 117, and/or by ramping down of the chamber temperature over time during growth of the emitter electrode 117.

Figure 6:
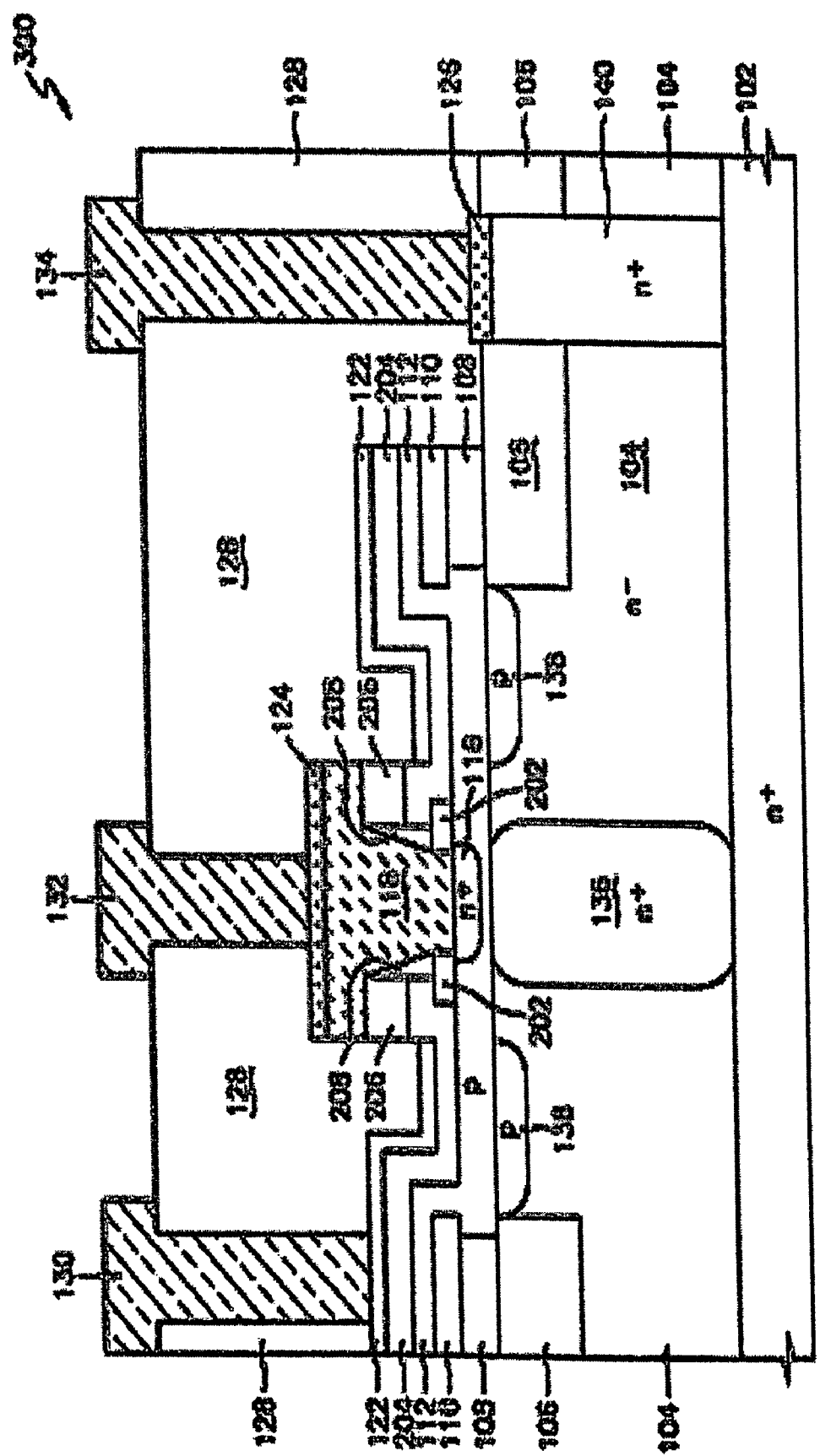
FIG. 6 is a schematic cross-sectional view of a bipolar transistor according to another embodiment of the present invention.

Attention is now directed to FIG. 6, which illustrates a third embodiment of the present invention. This embodiment differs from that of FIG. 2 in that a poly-silicon base electrode 204 is located over the base region 112, and with respect to the configuration of the emitter electrode 118, insulating layers 202 and 206, and sidewall spacers 208. All other reference numbers of FIG. 6 denote the same numbered elements discussed above in connection with FIG. 2.

More specifically, as shown in FIG. 6, a doped polysilicon base electrode 204 is located on the base region 112, with the silicide layer 122 being located on the base electrode 122. Further, the emitter electrode 118 is electrically isolated from the base electrode 204 by the sidewall spacers 208 and insulating layers 202 and 206. In contrast to the first embodiment, the sidewalls of the emitter electrode 118 are tapered in conformity with the sidewall spacers 208.

The bipolar transistor of FIG. 6 may also include base regions such as those identified by reference number 138 in FIG. 2.

As in the previous embodiments, the emitter electrode 118 may have a single-crystal structure, such as single-crystal Si or SiGe. Alternately, at least a portion of the emitter electrode in contact with the emitter region 116 may have a single-crystal structure, with a remaining portion having an amorphous or poly-crystalline structure, such as amorphous Si or SiGe, or poly-crystalline Si or SiGe.

A method of manufacturing the bipolar transistor of FIG. 6 will now be described with reference to FIGS. 7(A) through 7(E).

Initially, a structure is obtained which is the same as that shown in previously described FIG. 3(B). Then, referring to FIG. 7(A), an insulating layer 202 is patterned on the base region 112. Then, a doped poly-silicon layer 204 and an insulating layer 206 are successively deposited on the resultant structure. Then, an emitter window 115 is etched to expose the insulating layer 202.

Figure 7A:
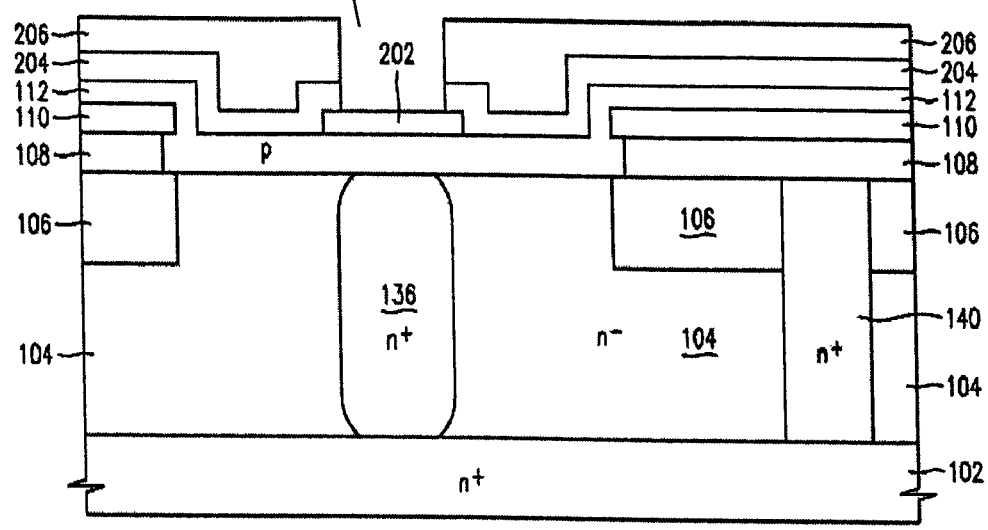
FIGS. 7(A) through 7(E) are schematic cross-sectional views for describing a method of manufacturing the bipolar transistor of FIG. 6.
Figure 7B:
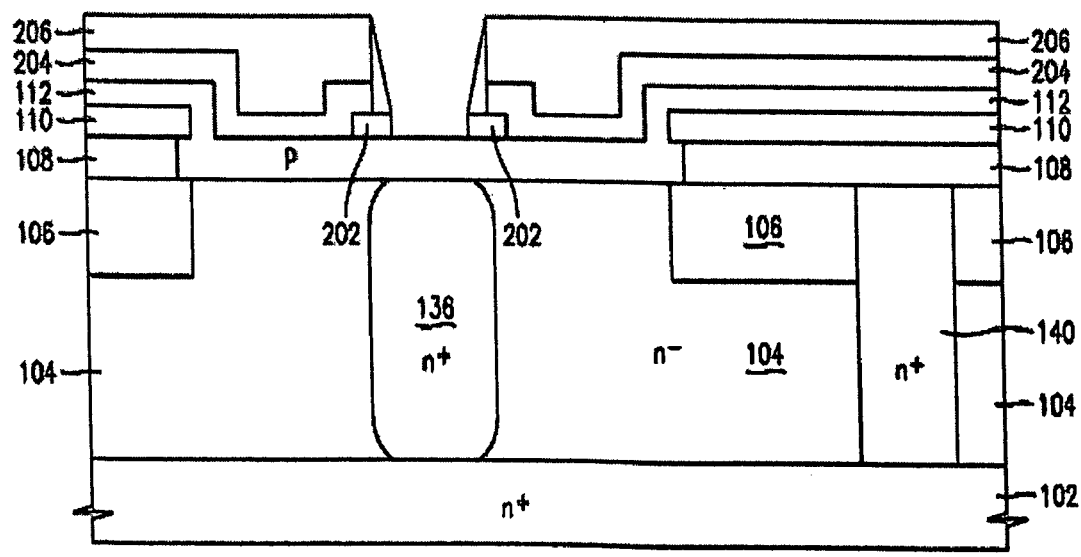

Referring to FIG. 7(B), insulating sidewall spacers 208 are formed on sidewalls of the emitter window 115 which expose the base region 112 by etching of a center portion of the insulating layer 202. Then, an overdoped N+ collector region 136 is formed by ion implantation through the emitter window 115. Alternately, to avoid ion implantation damage to the base layer 112, the N+ collector region 136 can be formed prior to deposition of the base region 112 by using a photoresist mask pattern. In either case, the emitter window 115 is formed.

Figure 7C:
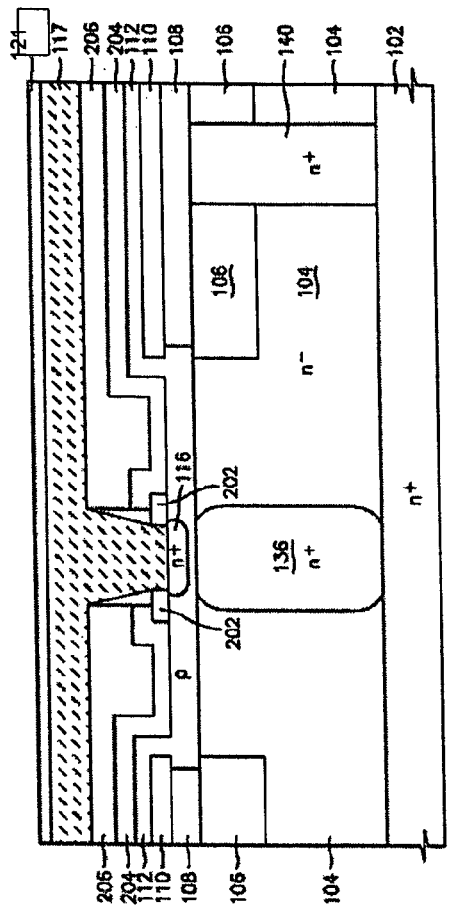

Next, as shown in FIG. 7(C), an emitter electrode layer 117 and a barrier layer 121 are formed. As shown, the emitter electrode layer 117 fills the emitter window 115 so as to contact the emitter region 116 (not yet formed).

In this embodiment, the emitter electrode layer 117 is formed by low temperature (less than 900° C.) epitaxial growth of single-crystalline Si, SiGe or a Si—SiGe composite. However, the emitter electrode layer 117 may be formed of a combination of single-crystal, poly-crystal and amorphous structures as discussed previously in connection with FIGS. 4 and 5. The emitter electrode layer 117 is N+ doped either in situ or by ion implantation, and preferably has a graded impurity concentration distribution in which an upper part of the emitter electrode layer 117 has a higher concentration than a lower part thereof. For example, the impurity concentration in the upper part may be in a range of $1\times10^{19}/cm^3$ to $1\times10^{22}/cm^3$, whereas the impurity concentration in the lower part may be in a range of $1\times10^{18}/cm^3$ to $1\times10^{20}/cm^3$.

Still referring to FIG. 7(C), after formation of the barrier layer 121, an emitter region 116 is then formed by diffusion of impurities from the emitter electrode layer 117 into an upper portion of the base layer 112. In the case of a heterojunction device in which the base layer 112 is a SiGe layer, the emitter region 116 is formed in the Si capping layer or in the Si capping layer and doped-SiGe layer of the base layer 112.

Figure 7D:
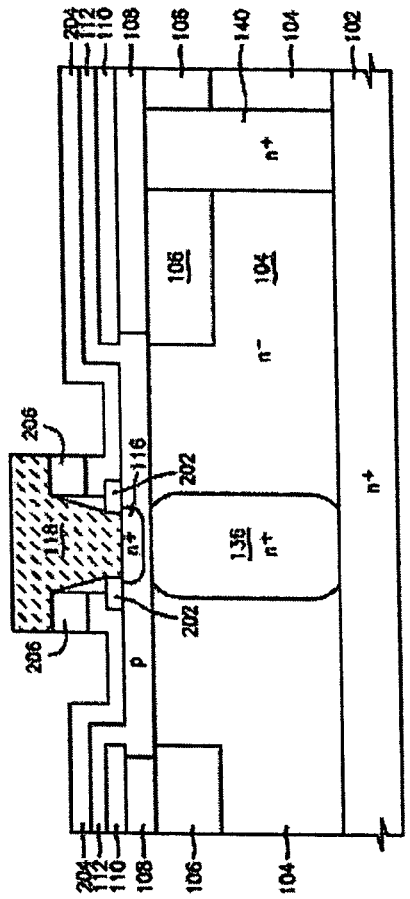

Next, as shown in FIG. 7(D), the emitter electrode layer 117 (FIG. 7(C)) is patterned by etching or chemical mechanical polishing to define an emitter electrode 118.

Figure 7E:
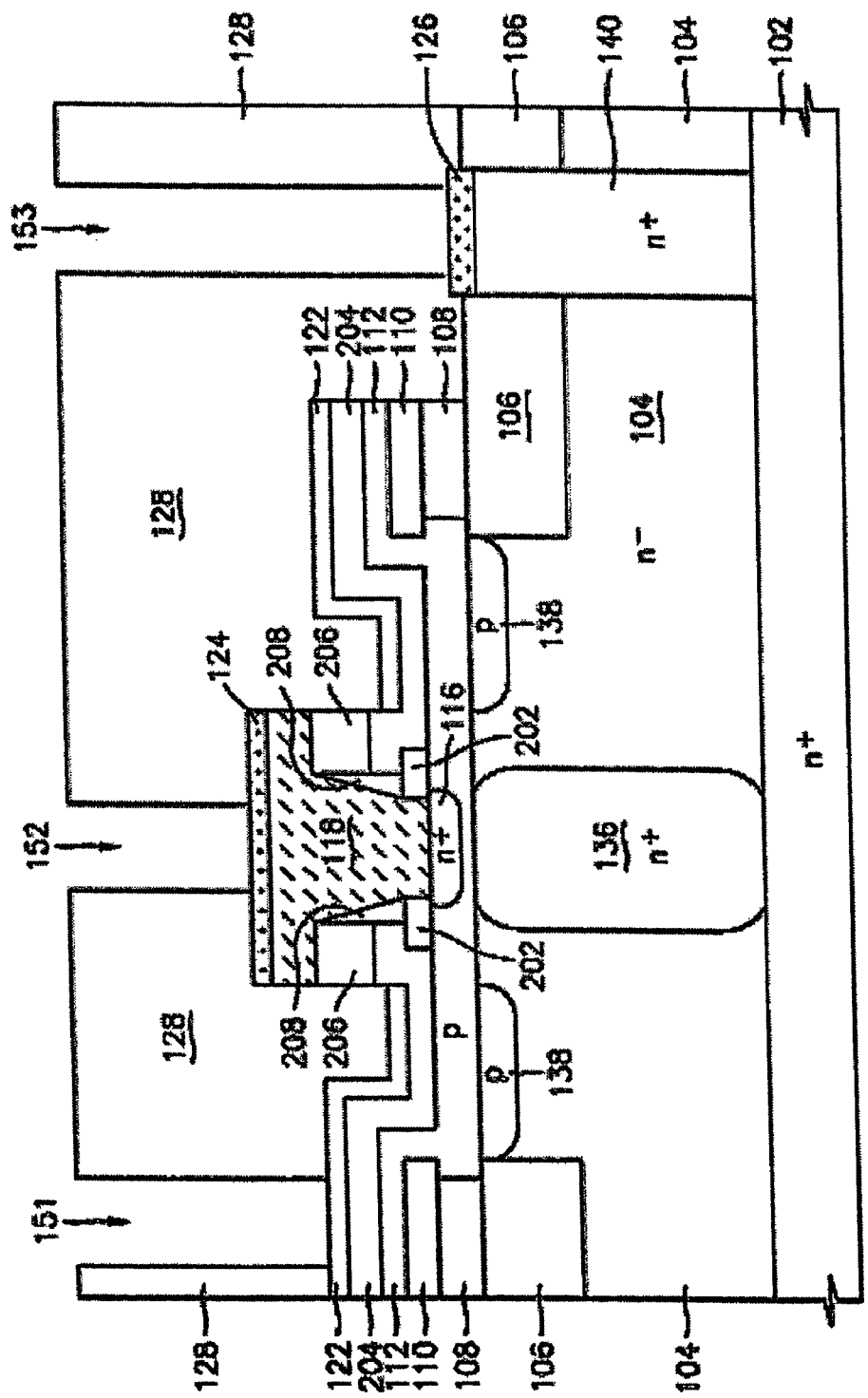

Referring now to FIG. 7(E), the base electrode 204, the base layer 112, and the underlying layers 110, 108 are patterned to expose the collector sink 140. Then, a silicidation process is executed to form silicide layers 122, 124 and 126 on the base electrode 204, the emitter electrode 118, and the collector sink 140, respectively. An insulating layer 128 is deposited over the resultant structure, and contact holes 151, 152 and 153 are formed to expose the silicide layers 122, 124 and 126. Finally, though not shown in FIG. 7(E), metal interconnects are filled into the contact holes 151, 152 and 153.

In the drawings and specification, there have been disclosed typical preferred embodiments of this invention and, although specific examples are set forth, they are used in a generic and descriptive sense only and not for purposes of limitation. It should therefore be understood the scope of the present invention is to be construed by the appended claims, and not by the exemplary embodiments.

What is claimed is:

1. A method for forming an emitter contact of a bipolar transistor, comprising:

growing an emitter electrode layer containing an impurity of a first conductivity type over a base layer of a second conductivity type, a first portion of the emitter electrode layer in contact with the base layer being grown to include a single crystalline structure and a second portion of the emitter electrode layer not in contact with the base layer being grown to include a polycrystalline structure;

forming an emitter region of the first conductivity type in the base layer; and forming a metal layer on the emitter electrode layer;

wherein a structural transition from the first portion to the second portion of the emitter electrode layer is gradual.

2. The method of claim 1, wherein the metal layer comprises a silicide layer, and wherein the method further comprises forming a metal contact layer on the silicide layer.

3. The method of claim 1, wherein an entirety of the emitter electrode layer is grown in the absence of a vacuum break.

4. The method of claim 1, wherein the emitter electrode layer comprises one of Si, SiGe or a composite of Si and SiGe.

5. The method of claim 1, wherein growing the emitter electrode layer comprises epitaxial growth at a temperature of less than 900°.

6. The method of claim 1, wherein the emitter region is formed by diffusion of impurities from the emitter electrode layer into the base layer.

7. The method of claim 1, wherein the emitter region is formed by ion implantation prior to growing the emitter electrode layer.

8. The method of claim 1, wherein the emitter electrode layer is formed such that an impurity concentration of the emitter electrode layer varies in a depth direction.

9. The method of claim 8, wherein an upper portion of the emitter electrode layer is formed with a higher impurity concentration than a lower portion of the emitter electrode layer.

10. A method of forming a bipolar transistor, comprising:
forming a collector region of a first conductivity type in a substrate;
forming a base layer, including growing a first epitaxial layer of a second conductivity type over an upper surface of the substrate;
forming an emitter electrode layer over the base layer, including growing a second epitaxial layer containing an impurity of the first conductivity type from an upper surface of the first epitaxial layer and growing a polycrystalline layer over the second epitaxial layer;
diffusing the impurity from the second epitaxial layer into the first epitaxial layer to form an emitter region of the first conductivity type in the first epitaxial layer; and
forming an metal layer on the emitter electrode layer;
wherein a structural transition between the second epitaxial layer and the polycrystalline layer is gradual.

11. The method of claim 10, wherein the metal layer comprises a silicide layer, and wherein the method further comprises forming a metal contact layer on the silicide layer.

12. The method of claim 10, wherein the second epitaxial layer is grown at a temperature of less than 900° C.

13. The method of claim 10, wherein an entirety of the emitter electrode layer is formed in the absence of a vacuum break.

14. The method of claim 10, wherein the metal layer is formed on the polycrystalline layer.

15. The method of claim 10, wherein the emitter electrode layer comprises one of Si, SiGe or a composite of Si and SiGe.

16. The method of claim 10, wherein at least the second epitaxial layer is formed to have an impurity concentration that varies in a depth direction.

17. The method of claim 16, wherein an upper portion of the second epitaxial layer is formed with a higher impurity concentration than a lower portion of the emitter electrode layer.

18. The method of claim 10, wherein the structural transition between the second epitaxial layer and the polycrystalline layer is achieved by increasing a chamber pressure.

19. The method of claim 10, wherein the structural transition between the second epitaxial layer and the polycrystalline layer is achieved by decreasing a chamber temperature.

* * * * *